United States Patent [19]

Golden et al.

[11] Patent Number: 5,245,131
[45] Date of Patent: Sep. 14, 1993

[54] CABINETS HAVING IMPROVED CABLE ENTRANCE SEAL

[75] Inventors: John L. Golden, Rockaway Township, Morris County, N.J.; Kevin E. Keller, Omaha, Nebr.; Howard D. Rhoten, Omaha, Nebr.; Shervin Shamloo, Omaha, Nebr.; Brian E. Underwood, East Hanover, N.J.

[73] Assignee: AT&T Bell Laboratories, Murray Hill, N.J.

[21] Appl. No.: 859,172

[22] Filed: Mar. 27, 1992

[51] Int. Cl.$^5$ .............................................. H02G 3/18
[52] U.S. Cl. ................................... 174/65 R; 277/178
[58] Field of Search ............ 174/65 R, 162 G, 153 G; 277/178, 181, 183, 189; 248/56

[56] References Cited

U.S. PATENT DOCUMENTS 4,180,297 12/1979 Abrams ................................ 277/178

Primary Examiner—Harold Broome
Attorney, Agent, or Firm—Donald E. Hayes, Jr.

[57] ABSTRACT

The present invention relates to a cabinet for containing and holding telecommunications apparatus coupled to telephone field cables. The cabinet includes a cabinet housing, at least one cable entrance port through the cabinet housing to allow cables to enter the cabinet and a cable entrance seal positionable around the cable and securable to the cabinet housing for sealing all openings between the cable and periphery of the cable entrance port. In particular, the cable entrance seal is a rigid collar capable of supporting a moisture-blocking material snugly around the cable positioned therein and is attachable to the cabinet by a twist and lock securing means. Furthermore, the rigid collar may be bifurcated into two sections to facilitate positioning of the collar around a cable when the cable has no free-ends available for the collar to be slid over. As disclosed herein, the moisture-blocking material may be a foam block comprising a plurality of concentric split rings registering with each other so that a split opening common to all of the rings extends radially from the periphery of the moisture-blocking material to its center.

12 Claims, 2 Drawing Sheets

CABINETS HAVING IMPROVED CABLE ENTRANCE SEAL

TECHNICAL FIELD

This invention relates to cabinets for containing and holding telecommunications apparatus coupled to telephone field cables. More particularly, this invention relates to cabinets of such kind comprising improved entrance cable seals.

BACKGROUND OF THE INVENTION

Various designs of cabinets exist for containing and holding telecommunications apparatus coupled to telephone field cables. Such cabinets are generally metal housings which provide a protective enclosure for feeder distribution interfaces in varied plant applications. To establish an interface between feeder and distribution cables, a number of buried cables, of up to four inches in diameter, are brought up through a concrete pad or foundation and into the bottom of the cabinet. Independent transmission conductors are then electrically connected into cross connect blocks housed in the cabinet. The particular arrangement of the connections within the cross connect blocks allows numerous communication lines to be established, thereby providing selectively controlled communications service via distribution cables throughout a desired local.

Due to the nature of the electrical connections made within the cabinet, certain environmental elements often adversely affect the communications circuit created. Excessive moisture is a common problem which often develops within telecommunications cabinets or enclosures.

In addition to rain, the most obvious type of external moisture, the evaporation of ground water may also introduce undesired moisture into the telecommunications equipment. In particular, various types of pedestal or ground-mounted cabinets presently used lack adequate structural mechanisms to prohibit moisture from rising out of the ground and into the cabinet. Due to the completely enclosing nature of conventional cabinets, evaporating ground moisture becomes entrapped within the cabinet with no simple and efficient manner of removing the moisture from the cabinet. Even though a variety of louver arrangements have been used to facilitate removal of excess moisture from the cabinets, such arrangements have not adequately alleviated the problem.

A common point of entrance for such ground moisture into the cabinets is through various openings which may exist around the cables at their initial entry point into the cabinet. Existing prior art cabinets have included flexible rubber boots as a means to close any gaps around the cables at their point of entry into the cabinet. However, such boots require a substantial number of elements to be properly installed and are therefore rather cumbersome to use in the field. Furthermore, the flexible boots often have a stepped tapered configuration, with each step sized to receive a cable having a particular outer diameter. Therefore, to install the flexible boot, portions of the boot must be cut away and discarded in order to appropriately receive the selected cable. Such manipulation of the boot is burdensome and time consuming for an operator installing a cable entrance seal to a cabinet.

In light of the above-identified problems with the present technology, what is needed and what seemingly is not provided by the prior art is a durable and easy-to-install cable entrance seal. Furthermore, the sought-after cable entrance seal should require only a minimal number, if any, separate parts to be properly installed. Still further, the sought-after cable entrance seal should be bifurcated so as to allow the seal to be easily installed around a cable having no free end for the seal to slide over.

SUMMARY OF THE INVENTION

The foregoing problems of the prior art have been overcome by the cabinet of the present invention and the improved cable entrance seal incorporated therein. The present cabinet is for containing and holding telecommunications apparatus coupled to telephone field cables and comprises a cabinet housing and at least one cable entrance port through the cabinet housing to allow cables to enter the cabinet. A cable entrance seal is also incorporated and positionable around the cable and securable to the cabinet housing for sealing all openings between the cable and the periphery of the cable entrance port. Furthermore, the cable entrance seal is a rigid collar capable of supporting a moisture-blocking material snugly around the cable positioned therein and is attachable to the cabinet by a twist and lock securing means.

In addition, the rigid collar may be bifurcated to facilitate positioning of the collar around a cable even when the cable has no free end available for the collar to be slid over. The moisture-blocking material of the preferred embodiment is a foam block comprising a plurality of concentric split rings registering with each other so that a slit opening common to all of the rings extends radially from the periphery of the moisture-blocking material to its center. Also in the preferred embodiment, the twist and lock securing means comprises at least one twist-lock tool which is an integral part of the rigid collar and capable of securely engaging at least one twist-lock notch which is an integral part of the cabinet.

BRIEF DESCRIPTION OF THE DRAWING

Other features of the present invention will be more readily understood from the following detailed description of specific embodiments thereof when read in conjunction with the accompanying drawings, in which.

DETAILED DESCRIPTION

Figure 1:
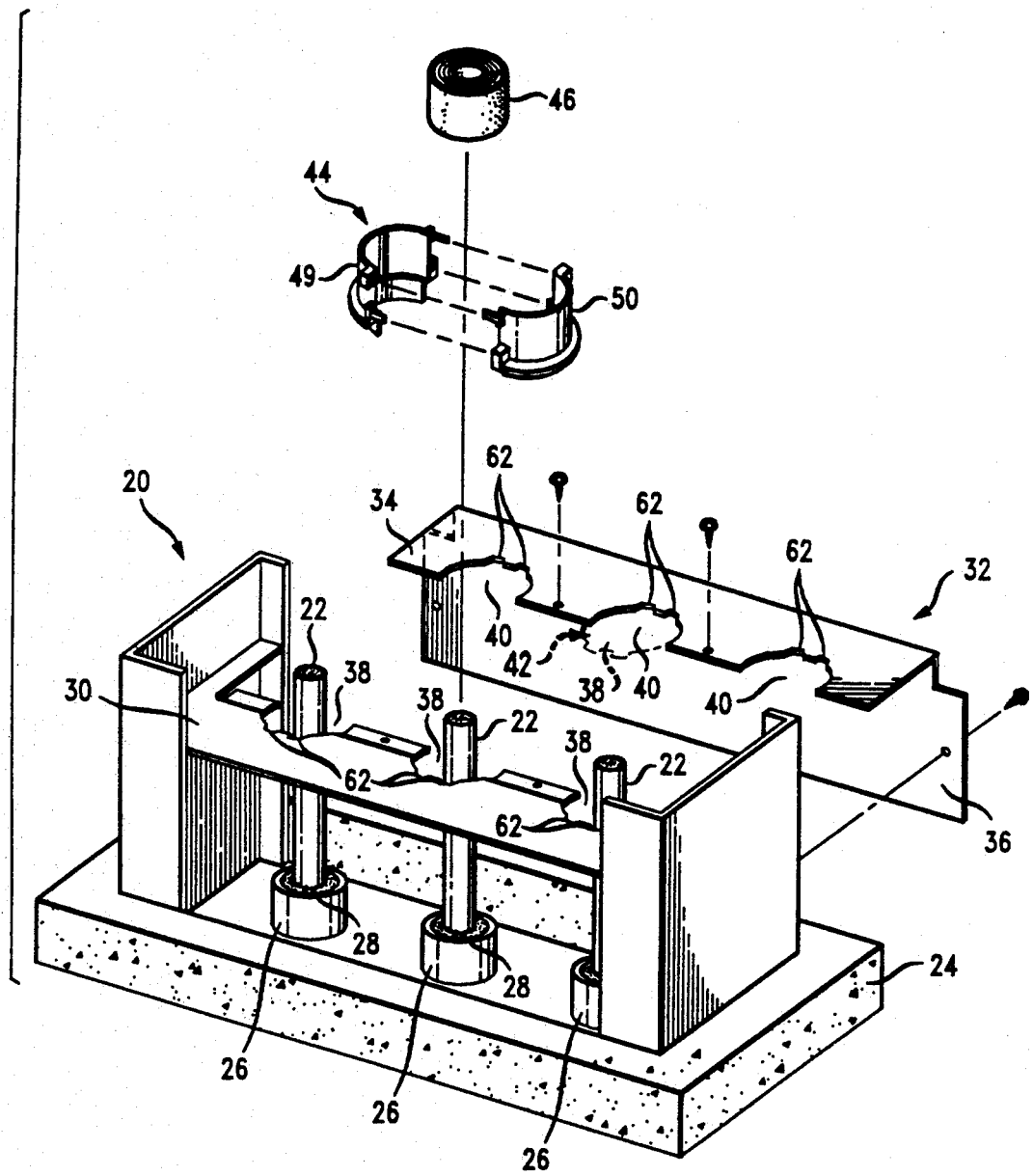
FIG. 1 is an exploded perspective view of a portion of a cabinet in accordance with the present invention having an improved cable entrance seal.

Referring now to FIG. 1, the reference numeral 20 designates a cabinet for containing and holding telecommunications apparatus (not shown) coupled to telephone field cables 22-22. In general, a cabinet 20 as referenced herein, is mounted on a concrete slab foundation 24 and configured so as to receive a plurality of telephone field cables 22-22 through the foundation 24 and into the bottom of cabinet 20. The specific details concerning the particular connections made into the cross connect blocks housed within the cabinet 20 are not explicitly shown nor described herein since such is not the essence of the present invention.

For the purpose of this description, each of the telephone field cables 22-22 are substantially similar in construction and orientation. Furthermore, each cable contains many pairs of insulated wire telephone conductors or leads.

Each of the field cables 22—22 exit the ground through foundation 24 within their respective conduits 26—26. The conduits 26—26 are positioned so as to extend only slightly above the concrete foundation 24. Therefore, each conduit 26 provides an upward passage through the concrete foundation 24 for each of their respective field cables 22—22. A filling material 28 may be disposed within the conduit 26 around a cable 22 to fill any gaps between each cable 22 and its respective conduit 26.

As illustrated in FIG. 1, cabinet 20 includes a lower shelf 30 which is horizontally affixed to create a bottom portion of the cabinet 20 to further complete the enclosure. However, in the preferred embodiment of the present invention, the lower shelf 30 does not extend to cover the entire depth of the cabinet 20, but instead establishes a bottom surface for only the front half of the cabinet. The lower shelf 30 may be constructed of sheet metal or any other similar material and may be secured to the inner walls of cabinet 20 by end flanges (not shown).

The cabinet 20 of the present invention further includes a bracket 32 having an "L" shaped cross-section. The bracket 32 has a horizontal web 34 oriented to engage lower shelf 30 such that the combination of these two elements, namely horizontal web 34 and lower shelf 30, establishes a complete bottom level which extends the entire horizontal area of cabinet 20. A vertical web 36 of bracket 32 is oriented to extend downward from horizontal web 34. Preferably, the physical dimensions of bracket 32 are such that when horizontal web 34 is properly engaged with lower shelf 30, vertical web 36 is aligned with a back surface (not shown) of cabinet 20.

Both the lower shelf 30 and the horizontal web 34 are adapted with a plurality of semi-circular indentions 38—38 and 40—40, respectively, along their inwardmost edge as shown in FIG. 1. Each of the semi-circular indentions 38—38 of lower shelf 30 and 40—40 of vertical web 34 are horizontally spaced and vertically aligned with one of the telephone field cables 22—22. When the lower shelf 30 and the horizontal web 34 are properly secured together, oppositely aligned semi-circular indentions 38—38 and 40—40 come together to establish a plurality of circular cable entrance ports 42—42 which provide throughways for each of the field cables 22 to enter the cabinet 20.

It should be noted that the "L" shaped bracket 32 is easily removable from the cabinet 20 and the lower shelf 30. Removal of the bracket 32 exposes the lowermost portion of cabinet 20 where the cables 22—22 extend through the concrete foundation 24 and into the cabinet 20. In addition, removing bracket 32 provides convenient and direct access to each of the semi-circular indentions 38 of lower shelf 30. Such direct, side access allows any or all of the cables 22—22 to be introduced into the cabinet 20 for subsequent splicing procedures, or disconnected and removed from the cabinet, without requiring that the entire cabinet be moved. Therefore, any wiring manipulations required within a particular cabinet are made drastically more convenient and efficient by the rear access feature provided by the "L" shaped bracket 30 as shown in FIG. 1. The particular steps involved in installing or rewiring such a cabinet are not the direct scope of this invention and are therefore not specifically detailed herein.

Figure 2:
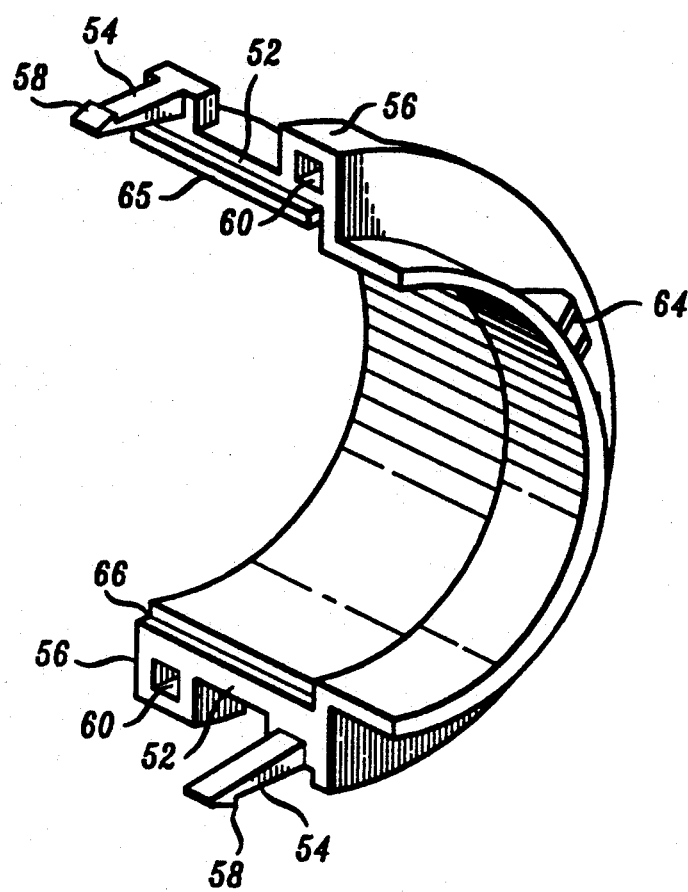
FIG. 2 is a detailed view of one-half of a rigid collar portion of the cable entrance seal of the present invention.

This invention is directed at a type of feeder distribution cabinet having an improved cable entrance seal as specifically depicted in FIGS. 1 and 2. As the cable enters the cabinet 20 via cable entrance ports 42—42, a gap exists around each cable 22 at its point of entry to the cabinet. Due to the environmental concerns mentioned above, for the electrical connections within the cabinet 20 to remain efficiently effective, these gaps must be blocked.

The improved cable entrance seal incorporated within a cabinet of the present invention provides an effective, durable and easy-to-install device for sealing the gap, as well as for assisting in securing each cable 22 as it enters the cabinet. A rigid collar 44 is used in the preferred embodiment of the present invention to hold a moisture-blocking material 46 in its desired position around each cable 22. The particular collar 44 disclosed herein is constructed in two substantially identical halves 48 and 50.

As illustrated in FIG. 1, the moisture-blocking material 46 is positioned around or slid over cable 22. Once in position around the cable 22, the two sections 48 and 50 of collar 44 are connected to each other so as to surround and secure the moisture-blocking material 46 snugly around the cable 22. Then, in accordance with FIG. 1, the rigid collar 44 and the associated moisture-blocking material 46 are attached to the bottom level of cabinet 20. As stated earlier, the bottom level of the cabinet disclosed herein is established by the adjoinment of lower shelf 30 and the horizontal web 34 of bracket 32.

With regard to the particular collar arrangement disclosed herein, the two sections 48 and 50 are preferably constructed of a relatively hard plastic material such as acrylonitrile-butadiene-styrene (ABS). Material such as PVC causes the particular collar arrangement disclosed herein to be rigid and durable, yet easy to handle during installation. Furthermore, in the preferred embodiment of the present invention, the moisture-blocking material 46 is a cylindrical foam block. In particular, the foam block includes a plurality of concentric split rings registering with each other so that a slit opening common to all the rings extends radially from the periphery of the foam block to its center. By removal of a selected number of the innermost of such concentric rings, the vertical axial aperture through the foam block, moisture-blocking material 46 is adjusted in diameter to be adapted to make a sealing fit with the outside of associated cable 22. One other embodiment utilizes at least two separate, but substantially identical, foam blocks so that once each is positioned around the associated cable 22, the particular radially extending slits for each block may be purposefully misaligned relative to each other. By misaligning the radial slits, no direct path for moisture flow exists through the moisture-blocking material 46.

FIG. 2 depicts details of one of the two sections 48 or 50 which when connected form the collar 44. As shown in FIG. 2, each of the semi-cylindrical sections 48 and 50 includes two interior planar surfaces 52—52. The formation of cylindrical collar 44 is completed by abutting corresponding interior planar surfaces 52—52 together. In the preferred embodiment of the present invention, a quick-release snap mechanism is utilized to securely connect each of the two semi-cylindrical sections 48 and 50 together.

Specifically, to facilitate such connection, each interior planar surface 52 is adapted with both a locking arm 54—54 and a locking arm receiving means 56—56. Preferably, each locking arm 54 is approximately one inch long and extends perpendicularly from planar interior surface 52. Furthermore, each locking arm 54 has a tapered protrusion 58 extending from its outermost end. The locking arm receiving means 56—56 is a relatively short, approximately one-half inch long, rectangular tunnel positioned with its opening 60 immediately adjacent to and parallelly aligned with planar surface 52.

As shown in FIG. 2, the arrangement of locking arms 54—54 and locking arm receiving means 56—56 is such that as the planar surfaces 52—52 of each semi-cylindrical section 48 and 50 are brought towards one another, each locking arm 54 becomes inserted into a corresponding locking arm receiving means 56. The particular dimensions of the locking arms 54—54 relative to the length of the tunnel 60 of receiving means 56 allows the tapered protrusion 58 to travel entirely through the tunnel and exit from the side of receiving means 56 opposite its entry point. Due to the outward extension of protrusion 58, the locking arm 54 must be depressed slightly inward as it is being initially positioned into receiving means 56. However, due to the rigidity and resilience of locking arm 54, the exiting of protrusion 58 from the receiving means 56 allows the locking arm to rebound slightly outward away from the semi-cylindrical sections 48 and 50. Such outward movement of the locking arm 54, in essence locks a non-tapered end protrusion 58 behind receiving means 56, thereby prohibiting undesired separation of the two sections 48 and 50. Likewise, a pressure on protrusions 58—58 applied downward toward their associated semi-cylindrical section, in conjunction with forces acting to separate sections 48 and 50 from each other, will act to disengage rigid collar 44 into its two separate sections.

In the preferred embodiment of the present invention, an extended protrusion 65 engages an indented plane 66 to assist in properly securing the semi-cylindrical sections 48 and 50 together. Specifically, an extended protrusion 65 and an indented plane 66 are incorporated into opposite planar surfaces 52—52 of each semi-cylindrical section 48 and 50. For example, when sections 48 and 50 are properly oriented, the length of an extended protrusion 65 of section 48 abuts the length of a corresponding indented plane 66 of section 50. Such abutment acts to prevent any slipping or sliding actions in the direction of the surface perpendicular to the widest surface of locking arm 54 as shown in FIG. 1. Indented plane 66 acts as a brake for the protrusion 65 and thereby prevents the locking arm 54 to be under excessive pressure. As presently designed, the extended protrusion 65 is approximately 0.1 inch in height and the indented plane 66 is approximately 0.1 inch deep.

In addition to the bifurcated configuration detailed above, the rigid collar 44 of the present cable entrance seal includes a twist and lock means of securing the collar 44 to the cabinet 20. Specifically, in the preferred embodiment of the present invention, the collar 44 is secured to the cabinet 20 at cable entrance ports 42 created at the above-described connection of lower shelf 30 and the horizontal web 34 of bracket 32. As part of the twist and lock securing means, each of the cable entrance ports 42 are adapted with twist-lock notches or cutouts 62—62. Preferably, four twist-lock notches 62—62 are circumferentially spaced around the outer edge of ports 42—42 such that two notches are located on lower shelf 30 and two notches are located on horizontal web 34. The twist and lock securing means further comprises a plurality of twist-lock tabs 64—64 configured to be securely received within corresponding twist-lock notches 62—62. The overall operation of the preferred twist and lock securing means allows each assembled rigid collar 44 to be adequately affixed to the cabinet 20 by interconnecting the twist-lock notches 62—62 and the twist-lock tabs 64—64 and rotating the collar 44 slightly. By performing this operation after various separate elements of the cable entrance seal have been assembled as detailed above, all gaps around the cables 22—22 at their point of entry into cabinet 20 are adequately sealed in accordance with the present invention.

Figure 3:
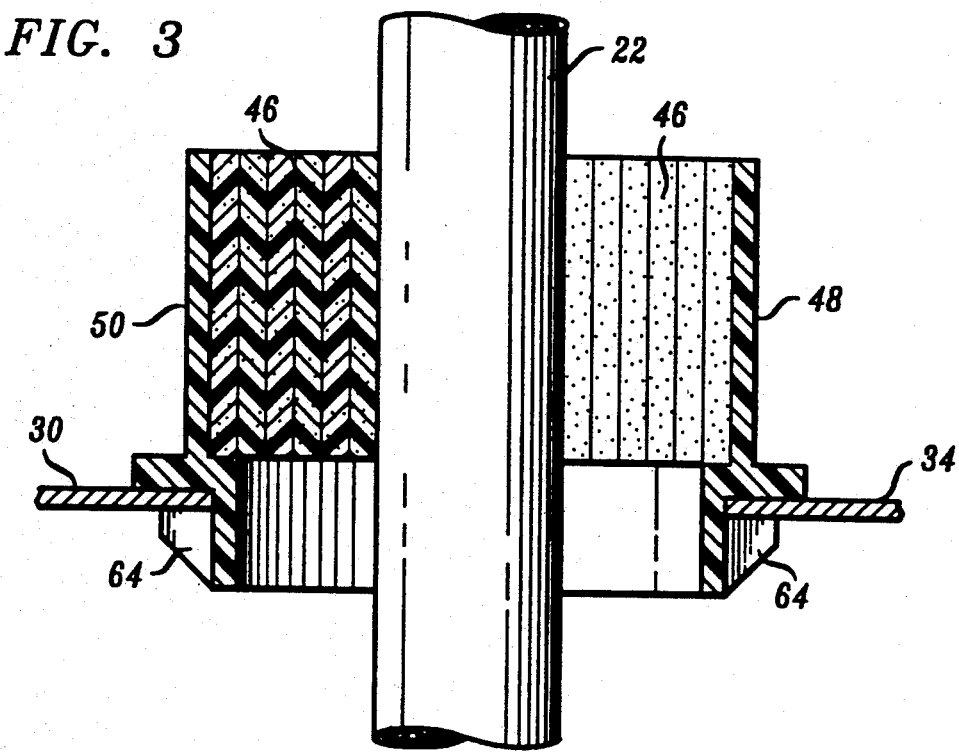
FIG. 3 is a cross-sectional view of a cable entrance seal of the present invention illustrated in use to secure a cable.

FIG. 3 is a cross-sectional representation of a cable 22 securely positioned within a cabinet 20 by a cable entrance seal in accordance with the present invention. Specifically, moisture-blocking material 46 surrounds the cable 22 and is snugly oriented by the connected semi-cylindrical sections 48 and 50. Furthermore, the entire cable entrance seal is affixed to horizontal web 34 and lower shelf 30 via twist-lock tabs 64—64 and twist-lock notches 62—62.

It is to be understood that the above-described arrangements are simply illustrative of the invention. Other arrangements may be devised by those skilled in the art which will embody the principles of the invention and fall within the spirit and scope thereof.

We claim:

1. A cabinet for containing and holding telecommunications apparatus coupled to telephone field cables comprises:

a cabinet housing;

at least one cable entrance port through the cabinet housing to allow cables to enter the cabinet;

a cable entrance seal positionable around a cable and securable to the cabinet housing for sealing all openings between the cable and periphery of the cable entrance port, wherein the cable entrance seal includes a rigid collar which secures a moisture-blocking material snugly around the cable positioned therein; and a twist and lock securing means for attaching the cable entrance seal to the cabinet housing.

2. The cabinet of claim 1 wherein said rigid collar is bifurcated to facilitate positioning of the collar around a cable even when the cable has no free-ends available for the collar to be slid over.

3. The cabinet of claim 1 wherein said moisture-blocking material comprises a plurality of concentric split rings registering with each other so that a split opening common to all of the rings extends radially from the periphery of the moisture-blocking material to its center.

4. The cabinet of claim 3 wherein the moisture-blocking material is a foam block.

5. The cabinet of claim 1 wherein said twist and lock securing means comprises at least one twist-lock tab capable of securely engaging at least one twist-lock notch.

6. The cabinet of claim 5 wherein the twist-lock tab is a integral part of the rigid collar and wherein the twist-lock notch is an integral part of the cabinet.

7. A cable entrance seal positioned around a cable and securable to a cabinet housing for sealing all openings between the cable and periphery of a cable entrance port, comprising a rigid collar which secures a moisture-blocking material snugly around the cable therein and a twist and lock securing means which attaches the cable entrance seal to the cabinet housing.

8. The cable entrance seal of claim 7 wherein said rigid collar is bifurcated to facilitate positioning of the collar around a cable even when the cable has no free ends available for the collar to be slid over.

9. The cable entrance seal of claim 7 wherein said moisture-blocking means comprises a plurality of concentric split rings registering with each other so that a slit opening common to all of the rings extends radially from the periphery of the moisture-blocking means to its center.

10. The cable entrance seal of claim 9 wherein the moisture-blocking means is a foam block.

11. The cable entrance seal of claim 7 wherein said twist and lock securing means comprises at least one twist-lock tab capable of securely engaging at least one twist-lock notch.

12. The cable entrance seal of claim 11 wherein the twist-lock tab is an integral part of the rigid collar and wherein the twist-lock notch is an integral part of the cabinet.

* * * * *